United States Patent

Ozaki

[11] Patent Number: 6,064,314
[45] Date of Patent: May 16, 2000

[54] INSPECTING SYSTEM FOR WELDING APPARATUS

[75] Inventor: Toshio Ozaki, Sayama, Japan

[73] Assignee: Honda Giken Kogyo Kabushiki Kaisha, Tokyo, Japan

[21] Appl. No.: 09/041,701

[22] Filed: Mar. 13, 1998

[30] Foreign Application Priority Data

Jul. 18, 1997 [JP] Japan ..................................... 9-194305

[51] Int. Cl.⁷ .................................................. G08B 21/00
[52] U.S. Cl. .......................... 340/679; 340/679; 219/109; 219/110
[58] Field of Search ..................................... 340/679, 680, 340/657, 661, 664, 635; 219/109, 110; 363/55; 361/78

[56] References Cited

U.S. PATENT DOCUMENTS 5,424,506  6/1995  Drake .

FOREIGN PATENT DOCUMENTS 0 764 495 A1  3/1997  European Pat. Off. .
5-177362  7/1993  Japan .

*Primary Examiner*—Jeffery A. Hofsass
*Assistant Examiner*—Daniel Previl
*Attorney, Agent, or Firm*—Nikaido, Marmelstein, Murray & Oram LLP

[57] ABSTRACT

An inspection system for a welding apparatus for performing welding by supplying electric power outputted by an inverter based on a command from a welding control unit, through a welding transformer to a welding gun. The inspection system includes a first input/output section for receiving positive and negative components of a waveform outputted by the inverter and for outputting waveforms, a second input/output section for receiving waveforms outputted by the welding control unit and for outputting waveforms similar to those outputted by the inverter. A selector selects the operation of either the first or second input/output sections. A first OR circuit has applied thereto the first waveforms outputted by the first and second input/output sections, and a second OR circuit has applied thereto the second waveforms outputted by the first and second input/output sections. A third OR circuit has the outputs of the first and second OR circuits applied to the inputs thereof. A comparator compares the number of waveforms outputted from the third OR circuit with a predetermined value within a predetermined time. If the number of the waveforms outputted is equal to or larger than the predetermined value, it can be determined that the welding control unit or the inverter is operating normally. If the number of the waveforms outputted is smaller than the predetermined value, it can be determined that the welding control unit or the inverter is operating abnormally.

5 Claims, 5 Drawing Sheets

6,064,314

INSPECTING SYSTEM FOR WELDING APPARATUS

BACKGROUND OF THE INVENTION

1. Field of the Invention

The present invention relates to an inspection system for a welding apparatus, and in particular, for determining whether the welding apparatus for performing welding by supplying electric power from an inverter based on a command from a welding control unit, through a welding transformer, to a welding gun, can normally function.

2. Description of the Related Art

There is a conventionally known inspection system adapted to measure whether an electric current and a voltage on a primary or secondary side of a welding transformer are defined values during welding, in order to determine whether such welding apparatus is normally functioning (see Japanese Patent Application Laid-open No. 5-177362).

In such an inspection means, even when it is determined by the inspection means that the welding apparatus is abnormal, it is impossible to determine whether there is an abnormality in the welding control unit or the inverter.

SUMMARY OF THE INVENTION

Accordingly, it is an object of the present invention to provide an inspection system which is capable of simply determining whether each of the welding control unit and the inverter in the welding apparatus, can normally function.

To achieve the above object, according to a first aspect and feature of the present invention, there is provided an inspection system for a welding apparatus for performing welding by supplying electric power from an inverter, based on a command from a welding control unit, through a welding transformer, to a welding gun, the inspection system comprising a waveform control means adapted to individually receive waveforms outputted from the inverter and waveforms outputted from the welding control unit and to output the same waveforms at each time, a within-time counting means for counting the number of waveforms outputted from the waveform control means for a predetermined time, and a determining means for comparing the number of waveforms counted by the within-time counting means with a predetermined value.

With the first feature, it is possible to individually determine whether the frequency of the output from each of the inverter and the welding control unit is a predetermined value, i.e., to individually determine the presence or absence of an abnormality in the inverter and the welding control unit, by individually receiving the waveforms outputted from the inverter and the welding control unit.

According to a second aspect and feature of the present invention, there is provided an inspection system for a welding apparatus for performing welding by supplying electric power from an inverter, based on a command from a welding control unit, through a welding transformer, to a welding gun, the inspection system comprising a first input/output section for receiving a positive component and a negative component of an AC waveform outputted by the inverter and for outputting first and second waveforms of the same polarity, a second input/output section for receiving first and second control waveforms outputted in correspondence to the positive and negative components of the AC waveform of the welding control unit and for outputting the first and second waveforms, as in the output by the inverter. An operation selecting means alternatively selects the operations of the first and second input/output sections. A first OR circuit has inputted thereto the first waveform outputted by the first input/output section, the first waveform outputted by the second input/output section, a second OR circuit has inputted thereto the second waveform outputted by the first input/output section and the second waveform outputted by the second input/output section, and a third OR circuit has inputted thereto a third waveform outputted by the first OR circuit and a fourth waveform outputted by the second OR circuit. A clock means clocks a predetermined time, and a counting means counts the number of fifth waveforms outputted by the third OR circuit within a predetermined time clocked by the clock means. A determining means individually determines the presence or absence of an abnormality in the inverter or the welding control unit corresponding to the first input/output section or the second input/output section whose operation has been selected, by comparing the number of waveforms counted by the counting means with a predetermined value.

With the second feature, it is possible to individually and accurately determine abnormalities of the respective frequencies of the output of the inverter and the welding control unit due to defects in portions of the waveforms outputted from the inverter and the welding control unit, by individually operating the first and second input/output sections.

According to a third aspect and feature of the present invention, the operation selecting means comprises first and second connections which are provided in the first and second input/output sections, respectively, and are individually connected to output portions of the inverter and the welding control unit.

With the third feature, the first and second input/output sections can be alternatively operated by an extremely simple operation of individually connecting the first and second connections to the output of the welding control unit and the inverter, thereby easily performing the individual determination of the presence or absence of an abnormality in the welding control unit and the inverter.

Further, according to a fourth aspect and feature of the present invention, connected to the determining means are a first indicating means for indicating that the welding control unit and/or the inverter are/is normal, when the number of waveforms counted by the within-time counting means is equal to or larger than a predetermined value, and a second indicating means for indicating that the welding control unit and/or the inverter are/is abnormal, when the number of waveforms counted by the within-time counting means is smaller than the predetermined value.

Yet further, according to a fifth aspect and feature of the present invention, connected to the determining means are a first indicating means for indicating that the welding control unit and/or the inverter are/is normal, when the number of waveforms counted by the counting means is equal to or larger than a predetermined value, and a second indicating means for indicating that the welding control unit and/or the inverter are/is abnormal, when the number of waveforms counted by the counting means is smaller than the predetermined value.

With the fourth and fifth features, it is possible to easily and accurately determine whether the welding control unit and/or the inverter are/is normal or abnormal, from the operative states of the first and second indicating means.

DETAILED DESCRIPTION OF THE PREFERRED EMBODIMENT

The present invention will now be described by way of an embodiment with reference to the accompanying drawings.

Figure 1:
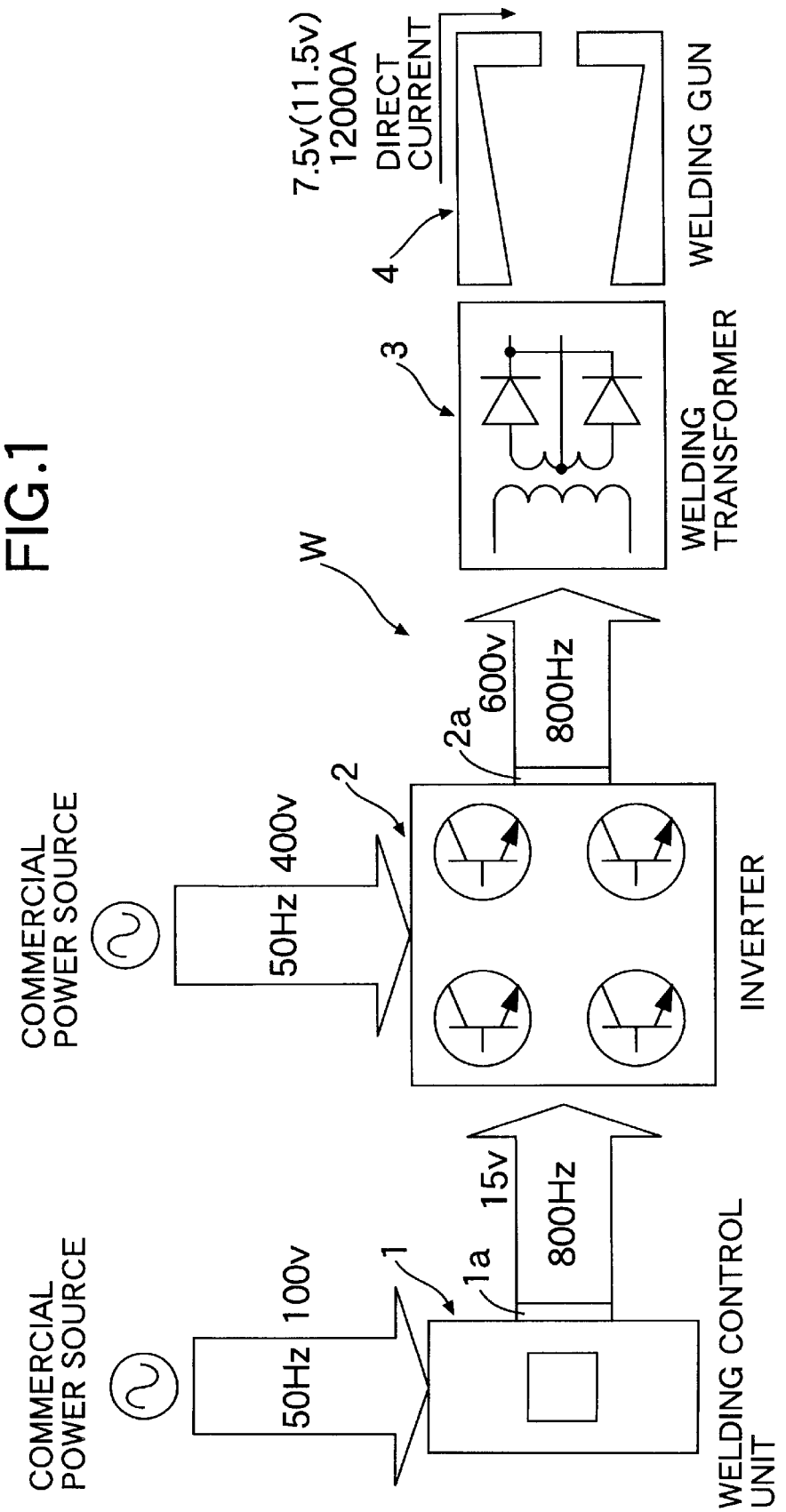
FIG. 1 is an illustration of a welding apparatus with which an embodiment of the present invention is used.

Referring first to FIG. 1, a welding apparatus W is comprised of a welding control unit 1, an inverter 2, a welding transformer 3 and a welding gun 4. A commercial power source of 100 V/50 Hz is connected to the welding control unit 1, and a commercial power source of 400 V/50 Hz is connected to the inverter 2. In welding, the welding control unit 1 first delivers a clamp signal to a clamp device (not shown) of the welding gun 4 to operate the clamp device to clamp a weld zone. After a lapse of a given time, the welding control unit 1 outputs a welding signal of 15 V/800 Hz to the inverter 2 for a predetermined time. Then, the inverter 2 converts power of 400 V/50 Hz supplied thereto from the commercial power source into power of 600 V/800 Hz, and the transformer 3 drops and rectifies the power of 600 V/800 Hz to 7.5 V to 11.5 V and converts it into a DC current of 12,000 A maximum to supply DC current to the welding gun 4. When a given time has lapsed from the cutting-off of the welding power, the welding control unit 1 outputs a clamp releasing signal to release the clamping of the weld zone by the welding gun 4.

Figure 2:
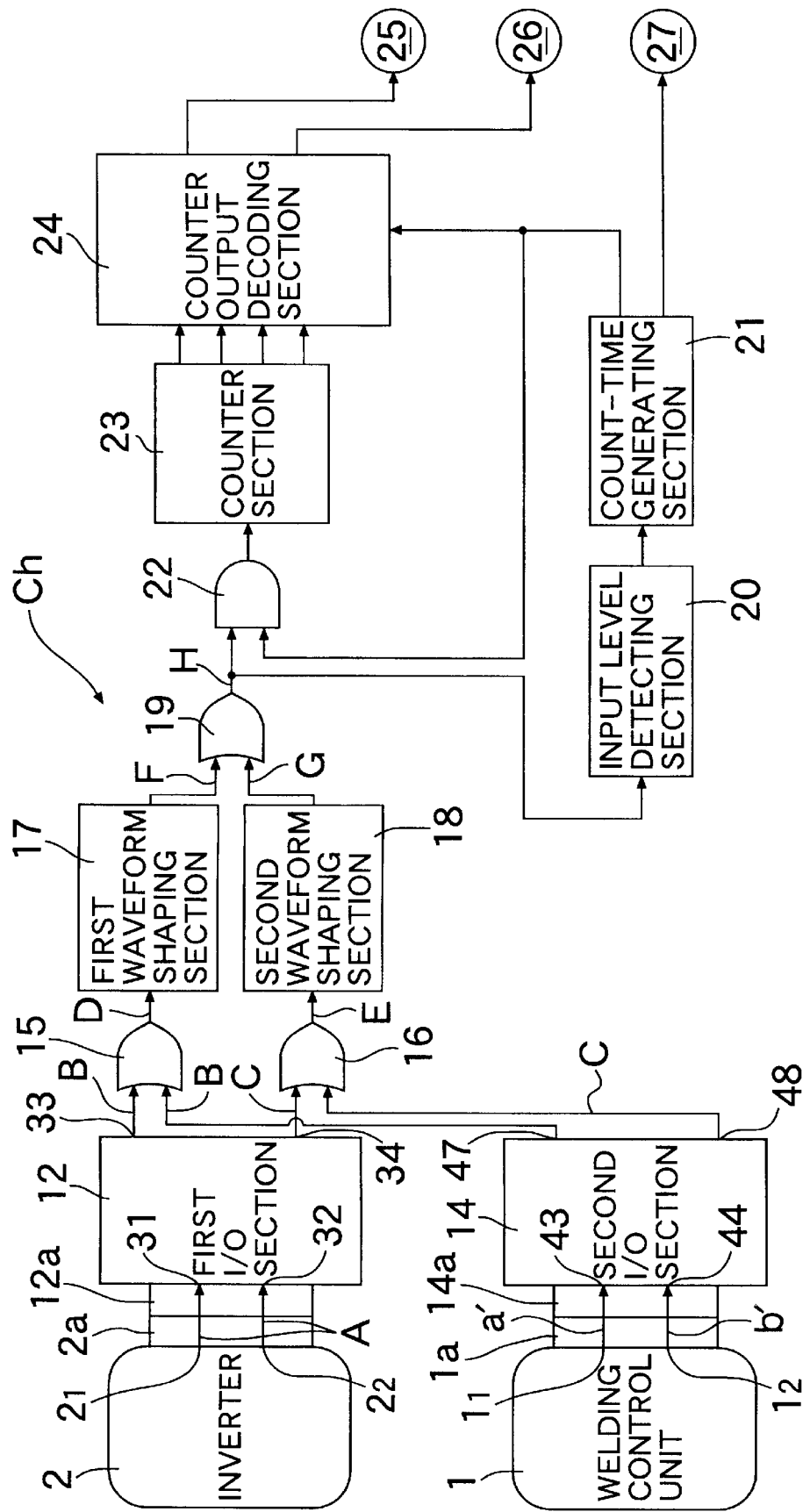
FIG. 2 is a block diagram illustrating a circuit arrangement of an inspection system for the welding apparatus according to the embodiment of the present invention.

An inspection system Ch of the present invention shown in FIG. 2 determines individually the presence or absence of abnormality of the inverter 2 and the welding control unit 1 in the welding unit W. The inspection system includes a first input/output section 12 having a first connection 12a capable of being connected to an output portion 2a of the inverter 2, and a second input-output section 14 having a second connection 14a capable of being connected to an output portion 1a of the welding control unit 1. If the first connection 12a is connected to the output portion 2a of the inverter 2, first and second input terminals 31 and 32 of the first input/output section 12, are connected to first and second output terminals $2_1$ and $2_2$ of the inverter 2. If the second connection 14a is connected to the output portion 1a of the welding control unit 1, first and second input terminals 43 and 44 of the second input/output section 14 are connected to first and second output terminals $1_1$ and $1_2$ of the welding control unit 1.

The first input/output section 12 has first and second output terminals 33 and 34, and the second input/output section 14 has first and second output terminals 47 and 48. The first output terminals 33 and 47 of the first and second input/output sections 2a and 1a are connected to a pair of input terminals of a first OR circuit 15, and the second output terminals 34 and 48 of the first and second input/output sections 2a and 1a are connected to a pair of input terminals of a second OR circuit 16.

First and second waveform shaping sections 17 and 18 are connected to output terminals of the first and second OR circuits 15 and 16, respectively. Output portions of the waveform shaping sections 17 and 18 are connected to a pair of input terminals of a third OR circuit 19.

Connected serially to an output terminal of the third OR circuit 19 are an input level detecting section 20, a count-time generating section 21 (a clock means) to which a signal from the input level detecting section 20 is inputted. Output terminals of the third OR circuit 19 and the count-time generating section 21 are connected to a pair of input terminals of an AND circuit 22.

A counter section 23 (a counting means) and a counter output decoding section 24 (a determining means) are serially connected to the output terminal of the AND circuit 22, and the output terminal of the count-time generating section 21 is connected to the counter output decoding section 24. The count-time generating section 21 and the counter section 23 constitute a within-time counting means of the present invention.

A normality indicating lamp 25 (a normality indicating means) and an abnormality indicating lamp 26 (an abnormality indicating means) are connected to a pair of output terminals of the counter output decoding section 24, respectively. Further, a signal generation indicating section 27 is connected to the output terminal of the count-time generating section 21 and is operated by a signal from the count-time generating section 21.

Figure 3:
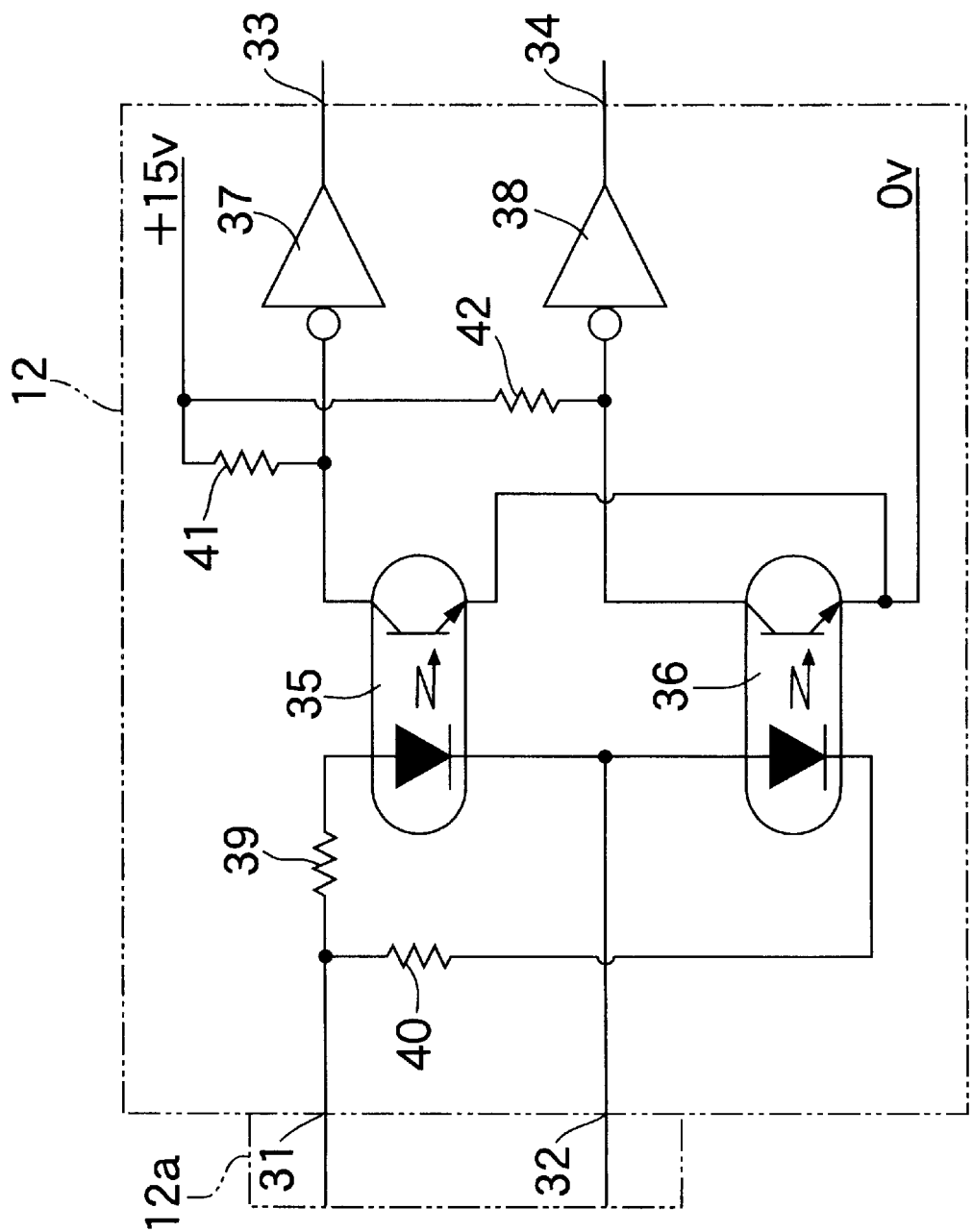
FIG. 3 is a circuit diagram of a first input/output section shown in FIG. 2.

The structure and operation of the first input/output section 12 will be described below with reference to FIG. 3.

The first input/output section 12 includes the first and second input terminals 31 and 32 at the first connection 12a, and the first and second output terminals 33 and 34 at the output portion. If the first connection 12a is connected to the output portion 2a of the inverter 2, an AC waveform A outputted by the inverter 2 at the first and second output terminals $2_1$ and $2_2$ is applied to the first and second input terminals 31 and 32. The AC waveform A is a waveform of 600 V/800 Hz shown at A in FIG. 5.

A first photo-coupler 35, a second photo-coupler 36, a first inverting amplifying circuit 37, a second inverting amplifying circuit 38 and four resistors 39, 40, 41 and 42 are connected between the first and second input terminals 31 and 32 and the first and second output terminals 33 and 34. A voltage of 15 V is normally applied to input terminals of the first and second inverting amplifying circuits 37 and 38 through the resistors 41 and 42. Therefore, if the first and second photo-couplers 35 and 36 are in their OFF states, outputs from the first and second inverting amplifying circuits 37 and 38 and thus, outputs from the first and second output terminals 33 and 34 assume a lower level.

Therefore, if a positive component a of the AC waveform A outputted by the inverter 2, is inputted to the first input terminal 31, a current flows from the first input terminal 31 via the resistor 39 and the first photo-coupler 35 to the second input terminal 32, thereby turning on the first photo-coupler 35, and hence, the output from the first output terminal 33 is brought into a higher level. If a negative component b of the AC waveform A is inputted to the first input terminal 31, a current flows from the second input terminal 32 via the second photo-coupler 36 and the resistor 40 to the first input terminal 31, thereby turning on the second photo-coupler 36, and hence, the output from the second output terminal 34 is brought into a higher level.

Figure 5:
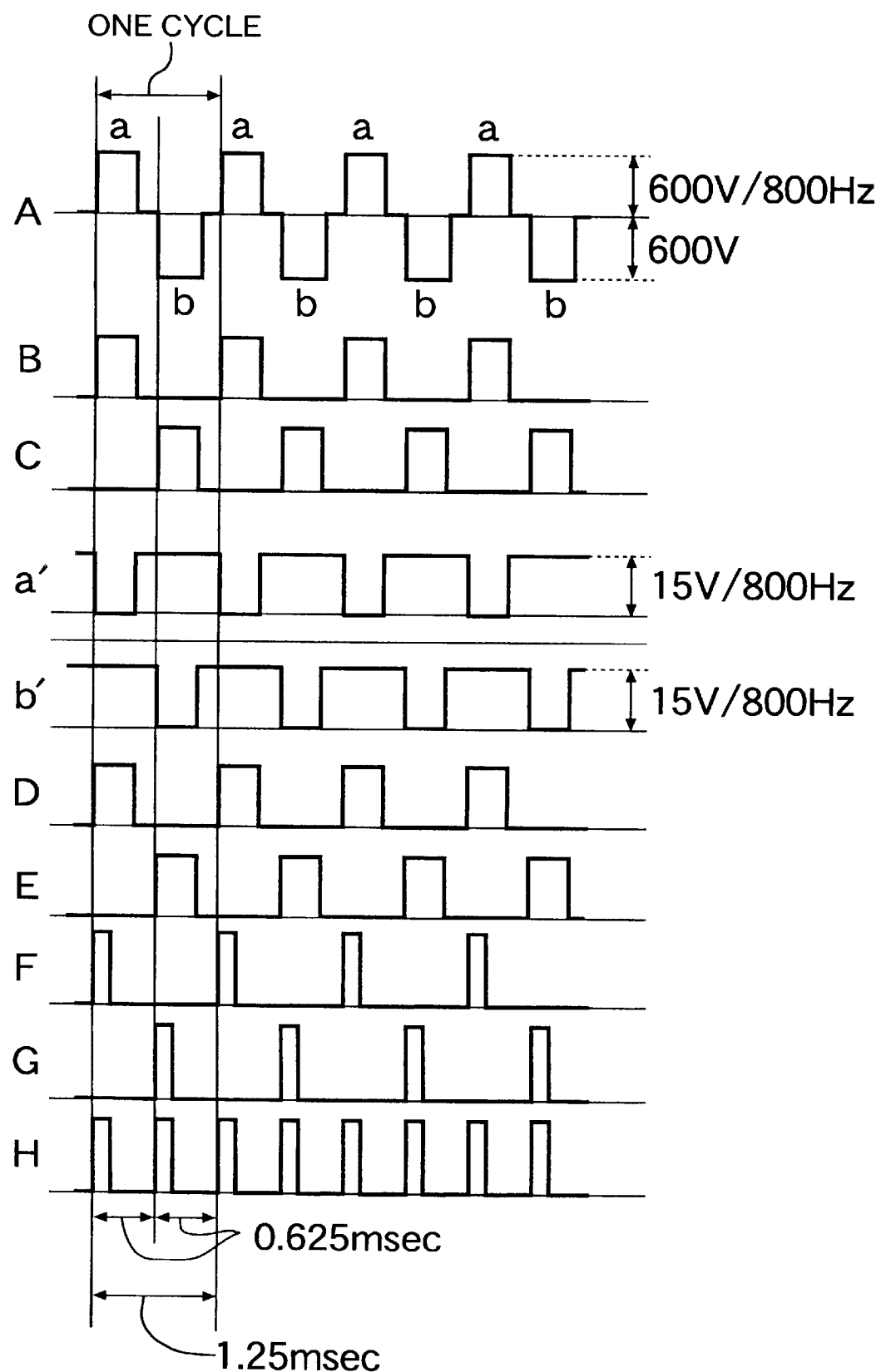
FIG. 5 is a diagram illustrating waveforms outputted from an inverter, a welding control unit and the inspection system shown in FIG. 2.

In this manner, the waveforms B and C outputted from the first and second output terminals 33 and 34 of the first input/output section 12, are positive waveforms, as shown in at B and C in FIG. 5, in correspondence to positive and negative components a and b of the waveform A outputted from the inverter 2.

Figure 4:
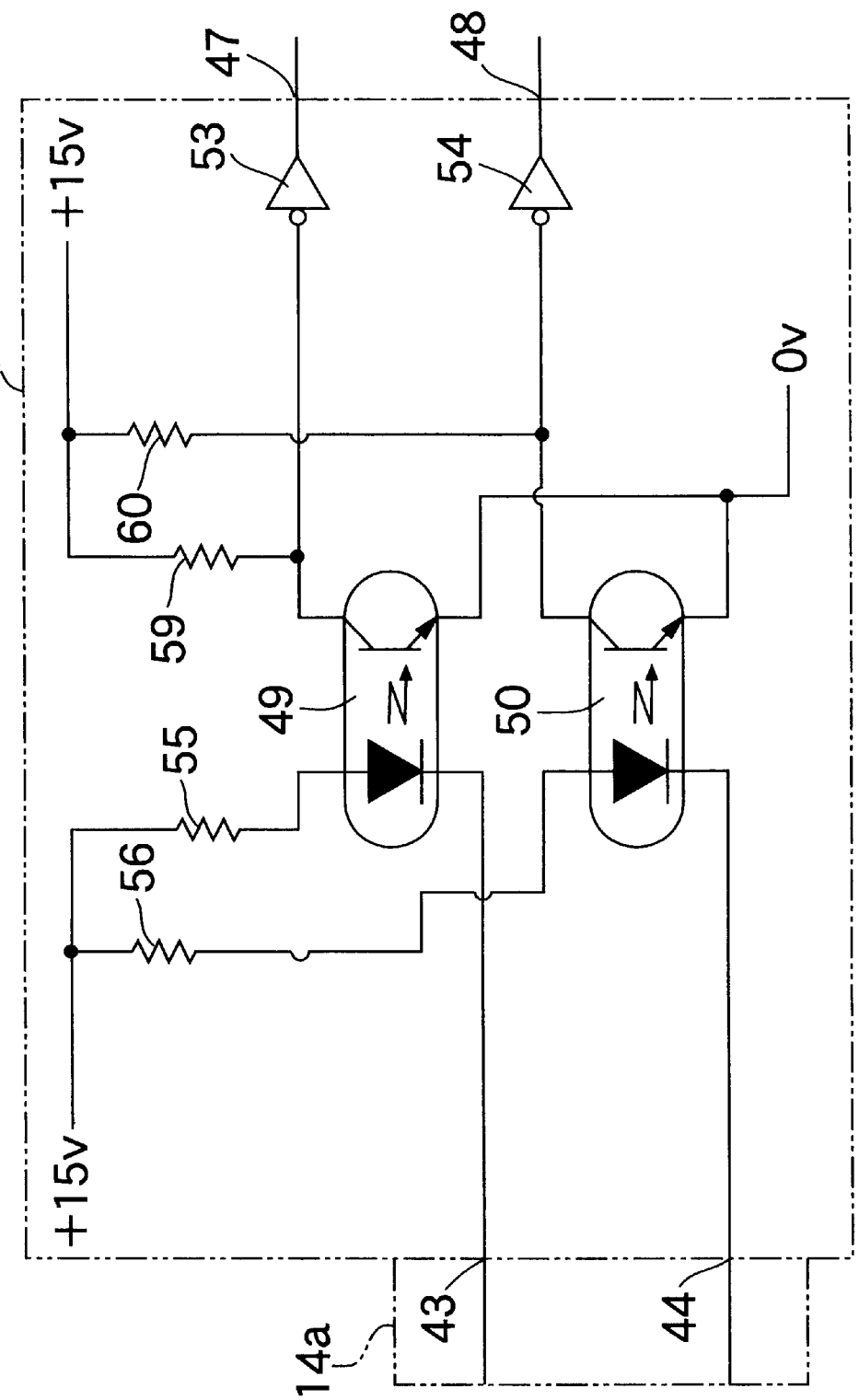
FIG. 4 is a circuit diagram of a second input/output section shown in FIG. 2.

The structure and operation of the second input/output portion 14 will be described below with reference to FIG. 4.

The second input/output section 14 includes the first input terminals 43 and 44 at the second connection 14a, and the first and second output terminals 47 and 48 at the output portions. If the second connection 14a is connected to the output portion 1a of the welding control unit 1, control waveforms a' and b' outputted by the welding control unit 1 in correspondence to positive and negative components a and b of the waveform A outputted from the inverter 2, are inputted from the first and second output terminals 1₁ and 1₂ to the first and second input terminals 43 and 44. Both of the waveforms a' and b' outputted by the welding control unit 1 are of 15 V and 800 Hz, as shown in at a' and b' in FIG. 5, but the waveform a' becomes zero V upon generation of the positive component a of the waveform A outputted from the inverter 2, and the waveform b' becomes zero V upon generation of the negative component b of the waveform A.

First and second photo-couplers 49 and 50, a first inverting amplifying circuit 53, a second inverting amplifying circuit 54 and four resistors 55, 56, 59 and 60 are connected between the first and second input terminals 43 and 44 and the first and second output terminals 47 and 48. A voltage of 15 V is normally applied to input terminals of the first and second photo-couplers 49 and 50 through the resistors 55 and 56, respectively, and a voltage of 15 V is also normally applied to input terminals of the first and second inverting amplifying circuits 53 and 54 through the resistors 59 and 60, respectively.

Thus, when the input to the first input terminal 43 is at a higher level, i.e., of 15 V, the first photo-coupler 49 is turned OFF. As a result, the input to the first inverting amplifying circuit 53 is brought to a higher level, and the output to the first inverting amplifying circuit 53, i.e., the output from the first output terminal 47 is brought to a lower level. Likewise, when the input to the second input terminal 44 is at a higher level, i.e., of 15 V, the second photo-coupler 50 is turned OFF. As a result, the input to the second inverting amplifying circuit 54 is brought to a higher level, and the output from the second inverting amplifying circuit 54, i.e., the output from the second output terminal 48 is brought to a lower level.

When the input to the first input terminal 43 is at a lower level, i.e., of zero V, current flows through the resistor 55, the first photo-coupler 49 and the first input terminal 43 to turn ON the first photo-coupler 49. As a result, the input to the first inverting amplifying circuit 53 is brought to a lower level, and the output from the first inverting amplifying circuit 53, i.e., the output from the first output terminal 47 is brought to a higher level. Likewise, when the input to the second input terminal 44 is at a lower level, i.e., of zero V, current flows through the resistor 56, the second photo-coupler 50 and the second input terminal 44 to turn ON the second photo-coupler 50. As a result, the input to the second inverting amplifying circuit 54 is brought to a lower level, and the output from the second inverting amplifying circuit 54, i.e., the output from the second output terminal 48 is brought to a higher level.

Therefore, if the waveform a' outputted from the welding control unit 1 is now inputted to the first input terminal 43, the output from the first output terminal 47 is brought to a higher level, only when the input to the first input terminal 43 is zero V. If the waveform b' outputted from the welding control unit 1, is inputted to the second input terminal 44, the output from the second output terminal 48 is brought to a higher level, only when the input to the second input terminal 44 is zero V. In this manner, the waveforms outputted from the first and second output terminals 47 and 48 are converted into the waveforms B and C of the same shape and the same phase as the waveform outputted from the first input/output section 12, in correspondence to the waveforms a' and b' outputted from the welding control unit 1.

In the foregoing, the first input/output section 12 and the second input/output section 14 form a waveform control means of the present invention.

Now, in using the inspection system Ch, the first connection 12a of the first input/output section 12 is first connected to the output portion 2a of the inverter 2, and only the first input/output section 12 is operated. In this case, the connection of the second connection 14a to the welding control unit 1 is not carried out, and the second input/output section 14 is put in a non-operative state.

Then, the waveforms B and C outputted from the first and second output terminals 33 and 34 of the first input/output section 12 are inputted to the first and second OR circuits 15 and 16, respectively. If the output portion 2a of the inverter 2 correctly outputs the AC waveform as shown at A in FIG. 5 at this time, waveforms D and E outputted from the first and second OR circuits 15 and 16 are of the same shape and the same phase as the waveforms B and C outputted from the first input/output section 12, as shown in FIG. 5. The waveform D outputted from the first OR circuit 15 is shaped into a waveform having a short pulse width, in the first waveform shaping section 17, as shown at F in FIG. 5, and then outputted. The waveform E outputted from the second OR circuit 16 is likewise shaped into a short pulse width waveform, in the second waveform shaping section 18, as shown at G in FIG. 5, and then outputted.

Then, if waveforms F and G outputted from the first and second waveform shaping sections 17 and 18 are inputted to the third OR circuit 19, a waveform H outputted from the third OR circuit 19 is as shown in FIG. 5. This waveform H is inputted to one of the input terminals of the AND circuit 22 and to the input level detecting section 20. In the input level detecting section 20, the frequency of the waveform H outputted from the third OR circuit 19 is detected, and if the detected frequency is equal to or higher than 400 Hz, a trigger signal is outputted from the detecting section 20 to the count-time generating section 21. The count-time generating section 21 which has received the trigger signal from the input level detecting section 20, outputs a higher-level signal to light the lamp of the signal generation indicating section 27 and to maintain an input to the one input terminal of the AND circuit 22 at a higher level for a predetermined time (10 msec in the embodiment).

The AND circuit 22, to which the output signals from the third OR circuit 19 and the count-time generating section 21 are applied, outputs the same signal as the signal outputted from the third OR circuit 19 only for 10 msec. The counter section 23 counts the number of the waveforms outputted from the AND circuit 22 for 10 msec, and outputs the waveform to the counter output decoding section 24. If the number of the waveforms is equal to or larger than a predetermined value, the counter output decoding section 24 permits the normality indicating lamp 25 to be lit, and if the number of the waveforms is smaller than the predetermined value, the counter output decoding section 24 permits the abnormality indicating lamp 26 to be lit.

More specifically, the frequency of the output from the inverter 2 is of 800 Hz (with a period of 1.25 msec) as described above and hence, the frequency of the output from the AND circuit 19 is of 1,600 Hz (with a period of 0.625 msec), and the number of waveforms for 10 msec is of 1,600×(10/1,000)=16. If a defect is generated in either of the positive or negative component a or b of the waveform A outputted from the inverter 2 and thus, the frequency of the output from the inverter 2 decreased to less than 800 Hz, the frequencies of the outputs from the first and second waveform shaping sections 17 and 18 is decreased to less than 800 Hz in accordance with such decrease and hence, the frequency of the output from the third OR circuit 19 is decreased to less than 1,600 Hz. As a result, the number of waveforms outputted for 10 msec by the AND circuit 19 is less than 16. Therefore, if the number of the waveforms becomes, for example, 13 or less, taking an error into account, then abnormality indicating lamp 26 is lit. If the number of the waveforms is equal to or greater than 14, the normality indicating lamp 25 is lit.

The inverter 2 is operated by a command from the welding control unit 1 and hence, when the normality indicating lamp 25 is lit during the inspection, it can be determined that not only the inverter 2 but also the welding control unit 1 are normal. However, when the abnormality indicating lamp 26 is lit, it means that either one of the inverter 2 and the welding control unit 1 has an abnormality.

In the latter case, the first connection 12*a* of the first input/output section 12 is then removed from the inverter 2; and the second connection 14*a* of the second input/output section 14 is connected to the output portion 1*a* of the welding control unit 1, and only the second input/output section 14 is operated. Then, the waveforms B and C outputted from the first and second output terminals 47 and 48 of the second input/output section 14 are inputted to the first and second OR circuits 15 and 16, respectively. If the welding control unit 1 correctly outputs the control waveforms shown at a' and b' in FIG. 5 at this time, the waveforms outputted from the first and second OR circuits 15 and 16 are of the same shape and the same phase as the waveforms outputted by the first and second OR circuits 15 and 16 when the inverter 2 has been inspected previously. Therefore, the first and second OR circuits 15 and 16 likewise output the waveforms D and E to the first and second waveform shaping sections 17 and 18 and hence, in accordance with this outputting, the first and second waveform shaping sections 17 and 18 output the shaped waveforms F and G. Thereafter, an operation similar to that described above is carried out, whereby the normality indicating lamp 25 is lit, when the welding control unit 1 is normal, and the abnormality indicating lamp 26 is lit, when the welding control unit 1 is abnormal. If the normality indicating lamp 25 is lit, it can be determined that the cause of lighting of the abnormality indicating lamp 26 during the previous inspection, resides in an abnormality of the inverter 2.

It is a matter of course that in carrying out the inspection, the welding control unit 1 may be first inspected.

In this way, it is possible to determine individually the presence or absence of an abnormality in the inverter 2 and the welding control unit 1 by a simple operation of alternatively connecting the first and second connections 12*a* and 14*a* to the output portions 2*a* and 1*a* of the inverter 2 and the welding control unit 1.

The voltage and the frequency outputted by the inverter 2 and the welding control unit 1, the count time outputted by the count-time generating section 21, the number of waveforms serving as a criterion for performing the determination of abnormality by the counter section 23 and the like in the above embodiment may be set at any value.

Although the embodiment of the present invention has been described in detail, it will be understood that the present invention is not limited to the above-described embodiment, and various modifications in design may be made without departing from the spirit and scope of the invention defined in claims.

I claim:

1. An inspection system for a welding apparatus for performing welding by supplying electric power from an inverter based upon a command from a welding control unit, said inspection system comprising a first waveform control means, coupled to the output of said inverter for generating waveforms corresponding to the output of said inverter; a second waveform control means coupled to the output of said control unit, for generating waveforms corresponding to the output of said control unit, the waveforms generated by the first and second waveform control means being the same with each other; counting means for counting the number of waveforms from either of said first waveform control means or said second waveform control means during a predetermined time period; determining means coupled to said counting means for comparing the number of waveforms counted by said counting means with a predetermined value; and an indicating device coupled to said determining means for indicating whether the number of waveforms counted is greater than or less than the predetermined value.

2. An inspection system for a welding apparatus as set forth in claim 1, wherein said indicating device comprises a first indicating means for indicating that said control means or said inverter is operating normally when the number of waveforms counted is equal to or larger than the predetermined value and a second indicating means for indicating that said control means or said inverter is operating abnormally when the number of waveforms counted is less than the predetermined value.

3. An inspection system for a welding apparatus as set forth in claim 1, wherein said counting means comprises a counter for counting the number of waveforms and clock means coupled to said counter for timing a predetermined time period, wherein said counter counts the number of waveforms during the predetermined time period.

4. An inspection system for a welding apparatus for performing welding by supplying electric power from an inverter based upon a command from a welding control unit, said inspection system comprising a first input/output section for receiving a positive component and a negative component of an AC waveform outputted by said inverter and for outputting first and second waveforms of the same polarity corresponding to the first and second waveforms applied thereto, a second input/output section for receiving first and second control waveforms outputted in correspondence to the positive and negative components of the AC waveform outputted by said welding control unit and for outputting third and fourth waveforms corresponding to said first and second waveforms applied thereto, an operation selecting means for selecting the operation of one of said first and second input/output sections, a first OR circuit, the first waveform outputted by said first input/output section and the third waveform outputted by said second input/output section being applied to the inputs of said first OR circuit, a second OR circuit having the second waveform outputted by said first input/output section and the fourth waveform outputted by said second input/output section applied to the inputs thereof, a third OR circuit, wherein a fifth waveform outputted by said first OR circuit and a sixth waveform outputted by said second OR circuit are applied to the inputs thereof, a clock means for timing a predetermined time period, a counting means for counting the number of waveforms outputted by said third OR circuit within the predetermined time period timed by said clock means, and a determining means for determining individually the presence or absence of an abnormality in either the inverter or the welding control unit corresponding to said first input/output section or said second input/output section the operation of which has been selected, by comparing the number of waveforms counted by said counting means with a predetermined value.

5. An inspection system for a welding apparatus as set forth in claim 4, wherein said determining means includes first indicating means for indicating that said welding control unit or said inverter is normal, when the number of waveforms counted by said counting means is equal to or larger than a predetermined value, and a second indicating means for indicating that said welding control unit or said inverter is abnormal, when the number of waveforms counted by said counting means is smaller than the predetermined value.

* * * * *